(12) United States Patent
Zheng et al.

(10) Patent No.: US 8,493,694 B2
(45) Date of Patent: Jul. 23, 2013

(54) FABRICATION OF A COERCIVITY HARD BIAS USING FEPT CONTAINING FILM

(75) Inventors: Min Zheng, Milpitas, CA (US);
Kunliang Zhang, Fremont, CA (US);
Min Li, Dublin, CA (US)

(73) Assignee: Headway Technologies, Inc., Milpitas, CA (US)

( * ) Notice: Subject to any disclaimer, the term of this patent is extended or adjusted under 35 U.S.C. 154(b) by 266 days.

(21) Appl. No.: 12/927,697

(22) Filed: Nov. 22, 2010

(65) Prior Publication Data
US 2012/0129007 A1    May 24, 2012

(51) Int. Cl.
*G11B 5/39*    (2006.01)
(52) U.S. Cl.
USPC .................................................... 360/324.12
(58) Field of Classification Search
USPC ............... 360/324.1, 324.11, 324.12, 324.2
See application file for complete search history.

(56) References Cited

U.S. PATENT DOCUMENTS

| | | | |
|---|---|---|---|
| 6,773,515 B2 * | 8/2004 | Li et al. | ................. 148/240 |
| 7,061,731 B2 | 6/2006 | Larson et al. | |
| 7,446,987 B2 * | 11/2008 | Zhang et al. | ............. 360/324.12 |
| 8,218,270 B1 * | 7/2012 | Zeltser et al. | ............. 360/324.12 |
| 2002/0015268 A1 | 2/2002 | Mao et al. | |
| 2005/0275975 A1 * | 12/2005 | Zhang et al. | ............. 360/324.12 |
| 2006/0114620 A1 | 6/2006 | Sbiaa et al. | |
| 2006/0132988 A1 * | 6/2006 | Zhang et al. | ............. 360/324.12 |
| 2006/0132989 A1 * | 6/2006 | Zhang et al. | ............. 360/324.12 |
| 2009/0091865 A1 * | 4/2009 | Zhang et al. | ............. 360/324.12 |
| 2009/0274931 A1 | 11/2009 | Qiu et al. | |
| 2010/0047627 A1 | 2/2010 | Yuan et al. | |

* cited by examiner

*Primary Examiner* — Jefferson Evans
(74) *Attorney, Agent, or Firm* — Saile Ackerman LLC; Stephen B. Ackerman

(57) ABSTRACT

The free layer of a CPP-TMR sensor is biased by laterally disposed hard bias (HB) layers that include a seedlayer structure, a magnetic layer structure of high coercivity material and a capping layer structure. The magnetic layer structure is a layer of FePt-containing material, such as FePtCu, while the seedlayers and capping layers include layers of Cr, CrTi, Fe, FeCo or FeCoMo. These combinations enable the promotion of the L10 phase of the FePt-containing material which provides a high coercivity magnetic layer structure at much lower annealing temperatures than in the prior art.

19 Claims, 2 Drawing Sheets

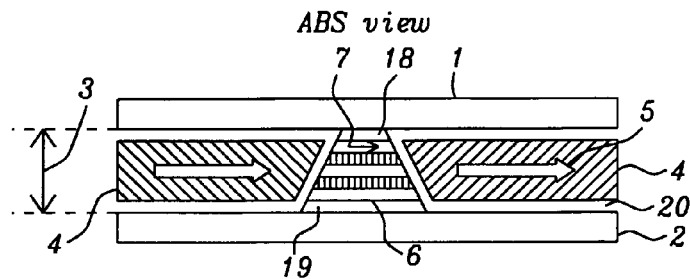
FIG. 1a – Prior Art
FIG. 1b – Prior Art
FIG. 1c – Prior Art
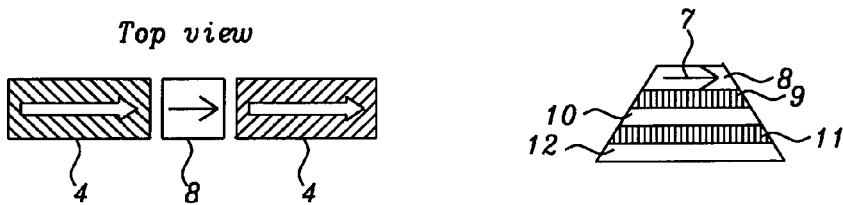
| | Film | Hc after 300C -10h (Oe) |
|---|---|---|
| A | FePtCu 250A/Ta55A | 640 |
| B | FeCoMo20A/FePtCu250A/FeCoMo20 A/Ta55 | 4289 |
| C | FeCoMo20A/FePtCu125A/FeCoMo5A/FePtCu125A/FeCoMo20A/Ta55A | 5240 |
| D | CrTi30A/FePtCu125A/FeCoMo5A/FePtCu125A/CrTi30A | 5343 |
| E | FePtCu125A/FeCoMo5A/FePtCu125A/FeCoMo20A/CrTi30 | 4322 |
FIG. 2

FABRICATION OF A COERCIVITY HARD BIAS USING FEPT CONTAINING FILM

BACKGROUND OF THE INVENTION

1. Field of the Invention

This invention relates generally to the fabrication of a MR sensor. In particular it relates to an MR sensor in which a free layer is biased by a layer of high coercivity FePt-containing material.

2. Description of the Related Art

With the ever increasing areal density with which data is stored on magnetic media, such as magnetic disks in hard disk drives (HDD), the magneto-resistive (MR) sensor that is used as the read-back element in the HDD is required to have a correspondingly improved spatial resolution while achieving and maintaining a reasonable signal-to-noise ratio (SNR). Referring to schematic FIGS. 1a, 1b and 1c, there are shown three views of a generic, prior-art current-perpendicular-to-plane (CPP) MR read head. FIG. 1a illustrates the read head in a vertical cross-sectional plane parallel to its air bearing surface (ABS) plane. FIG. 1b illustrates the read head from an overhead view of a horizontal cross-sectional plane through its magnetically free layer (discussed below). FIG. 1c is a portion of the illustration of FIG. 1a, isolating the sensor stack portion of the head.

Referring to FIG. 1a, there is shown the MR head, which could be a CPP-GMR head (current perpendicular-to-plane giant-magneto-resistive head), in which there is a current that passes perpendicularly to the active magnetic layers, through the entire head structure and in which the resistance of the head varies in accord with the physical principles of the giant-magneto-resistive effect. Alternatively, the head could be a CPP-TMR (current perpendicular-to-plane tunneling magneto-resistive) head, in which there is a current that passes perpendicularly to the active magnetic layers through the entire head structure and in which the resistance of the head varies in accord with the physical principles of the tunneling-magneto-resistive effect. Either of these particular types of head, which are state-of-the-art read-back heads, will be improved by the advantageous properties of the hard biasing layer of the present invention.

FIG. 1a shows the following physical elements of the generic prior art head. Looking vertically downward, there is first shown an upper (or top) shield (1) that protects the sensor stack (6) from extraneous magnetic fields. At the bottom of the head, there is shown a substrate, that is typically a corresponding lower (or bottom) shield (2) that performs a similar task at the bottom edge of the sensor. Thus the sensor is protected by a pair of shields at some desired separation (3).

Hard bias (HB) magnets (4) (magnets formed of high coercivity magnetic material) are laterally disposed to either side of the sensor stack (6). These magnets, which stabilize the magnetization of the free layer (8) are positioned between the shields (1), (2) and their magnetizations are shown as arrow (5). These hard magnetic layers, which are the subject of this invention, are formed on seedlayers (20) that promote the requisite crystalline anisotropy. The sensor stack itself (6) is typically formed as a patterned lamination of five horizontal layers, formed beneath an upper capping layer (18). An arrow (7) shows the direction of magnetization of the magnetically free layer of the sensor stack, as seen in FIG. 1c.

FIG. 1b is a horizontal cross-sectional slice through the two HB layers (4) and the magnetically free layer (8) of the sensor stack, as will be discussed below.

Referring to FIG. 1c, there is shown a schematic, illustration of the isolated sensor stack (6) of FIG. 1a showing the following five horizontal layers: the magnetically free layer (8), showing its magnetization vector as an arrow (7); a layer (9) that is a dielectric layer that serves as a tunneling barrier layer for the TMR sensor, or is a conducting layer for the GMR type sensor, a reference layer (10) relative to whose magnetization the free layer magnetization moves, a coupling layer (eg. a layer of Ru) (11), a pinned layer (12) whose magnetization is held spatially fixed by a thick layer (19) of antiferromagnetic material that also pins layer (10). The hard biasing layers (4), with longitudinal magnetization (5), provides a biasing magnetic field in the sensor stack (6) to orient the magnetization (7) of the free layer (8) in a longitudinal direction. A capping layer (18) is positioned between the free layer (8) and the upper shield (1). In forming the sensor, the stack and the hard bias layers are defined by a single etching process that insures they are at the same height.

Recently much attention has been given to improving the hard biasing of the MR sensor. The state-of-the-art magnetic biasing element is usually a structure comprising a Cr containing seedlayer, followed by a CoCrPt or CoPt hard magnetic thin film. The magnetic biasing field provided by the bias film must be sufficiently high to achieve stabilization of the free layer. As sensors are made smaller and smaller to achieve the required high areal recording density, as discussed above, the free layer becomes more volatile magnetically and more difficult to bias.

Much interest has been shown in L10 FePt film as a hard magnetic substance due to its higher saturation magnetization and high coercivity. Qiu et al., (US Publ Pat. Appl. 2009/0274931) discloses 20Pt/$Fe_{62}Pt_{38}$/20Pt film that achieves a coercivity of 5100 Oe after being annealed for 4 hrs at 300° C. Hua et al. (US Publ. Pat. Appl. 2010/0047627) disclosed a 10Pt/10$Fe_{40}Pt_{60}$/150 A $Fe_{65}Pt_{35}$/10$Fe_{40}Pt_{60}$/10Pt film that achieved a remanent coercivity of about 6000 Oe after being annealed for 4 hrs at 300° C. In both disclosures, a Pt capping layer and seedlayer are key to achieving high coercivities at moderate annealing conditions.

The cited prior art above, as well as other prior art relating to the use of various seedlayers and capping layers in forming magnetic films of high coercivity under moderate annealing condition, has led us to consider some particularly advantageous combinations that are particularly suitable for the hard biasing of MR sensors. Other prior art relating to this area includes Mao et al. (US Publ. Pat. Appl. 2002/0015268), Larson et al. (U.S. Pat. No. 7,061,731) and Sbiaa et al. (US Publ. Pat. Appl. 2006/0114620). Although this prior art discloses the use of FePt films together with seedlayers and capping layers, the combinations described herein and their advantageous properties are not disclosed.

SUMMARY OF THE INVENTION

It is an object of this invention is to provide a hard bias (HB) layer to stabilize the free layer of an MR sensor.

It is a further object of this invention to provide such a HB layer that promotes the L10 phase of FePt as a particularly advantageous HB material.

It is a further object of this invention to satisfy the previous objects while utilizing less expensive seedlayer material than is required for other Pt alloyed forms.

It is yet a further object of this invention to achieve the first object while possibly requiring no seedlayer, so that the distance between the HB layer and the free layer is reduced and biasing strength is improved.

It is still a further object of this invention to provide a HB alloy material that is tunable in thickness for use with different FePt compositions.

It is a further object of this invention to provide a magnetic seedlayer/capping layer combination that provides an additional magnetic moment to the HB element.

These objects will be met by a MR read head design (preferably a CPP TMR read head) in which a layer of $Fe_{47.5}Pt_{47.5}Cu_5$ is used as the HB film to bias the sensor free layer. Significant experimentation on this layer material, applying a variety of seedlayer and capping layer combinations and after annealing for 10 hrs at 300° C. in a vacuum, has shown that highly attractive values of coercivity and magnetic moment can be obtained with the proper choices. In particular, proper choice of seedlayer and capping layer promotes the growth of the L10 phase of Pt, as is indicated by the increase in coercivity. Of additional interest is the fact that under certain conditions a high coercivity layer can be obtained without the use of any seed layer, indicated that such a material can be used to form a HB layer that is closer to the free layer, leading to a highly effective biasing structure. Finally, it is found that certain seedlayers containing Fe, such as FeCoMo, provides the FePt(Cu) HB layer with the additional benefit of a higher saturation magnetization (Ms). Moreover, such FeCoMo seedlayers can be adjusted in thickness according to the composition of the FePt film.

BRIEF DESCRIPTION OF THE DRAWINGS

FIG. 1a is a schematic representation of a prior-art CPP-MR read head as viewed from the ABS.

FIG. 1b is a schematic representation of the prior-art CPP-MR read head of FIG. 1a, now as viewed from above at a horizontal cross-sectional level taken through the free layer.

FIG. 1c is a schematic, more detailed representation of the sensor stack of the prior-art CPP-MR read head of FIG. 1a as viewed from the ABS.

FIG. 2 is a Table showing the resulting Hc obtained when a film of $Fe_{47.5}Pt_{47.5}Cu_5$ is situated between various seedlayer and capping layer combinations and annealed for 10 hrs at 300° C. in a vacuum.

DESCRIPTION OF THE PREFERRED EMBODIMENT

The preferred embodiments of this invention are tunneling magnetoresistive (TMR) sensors, in a current-perpendicular-to-plane (CPP) configuration, in which the free layer is longitudinally biased by a pair of laterally disposed hard bias (HB) layers, each formed as a layer of $Fe_{47.5}Pt_{47.5}Cu_5$ (hereinafter referred to simply as FePtCu) sandwiched between various combinations of seedlayers (i.e., seedlayer structures that may be single layers or bilayers) and capping layers (i.e., capping layer structures that may be single layers or bilayers) or, in one embodiment, with the FePtCu layer having an intermediate layer of FeCoMo inserted between two such layers and in yet another embodiment with no seedlayer being required and, therefore, less distance between the biasing layer and the free layer.

In alternative embodiments, the HB layer can be a layer of FePt or a layer designated FePtX, where X can be a doping material of Cu or Ag and where the layer is formed between approximately 50 Angstroms 300 Angstroms and deposited on the seed layer structure. In all embodiments, the composition of the FePt film is about 25 atom-percent to 75 atom percent Fe (at % Fe), with the Pt as remaining balance or with the X as a doping material having an atom-percent of between 0% and 15%.

Referring to FIG. 2, there is shown a table of experimental results in which the coercivity of a FePtCu layer was obtained after annealing in a vacuum, for 10 hrs. at 300° C. The results of these experiments suggest that the following HB formations would perform highly advantageously in TMR devices such as will be discussed in FIGS. 3a and 3b below.

Row A of the table shows that Ta capped 250 Angstroms (A) thick layer of FePtCu achieves a coercivity of only 640 Oe. This indicates that nearly no amount of the L10 phase of the Pt has been formed.

In row B of the table, 20 A of $Fe_{85}Co_{10}Mo_5$ (referred to now as FeCoMo) has been used as both a seedlayer and capping layer on the FePtCu, producing a coercivity of 4289 Oe. It is noted that the FeCoMo seedlayer depositions, when used, are by ion beam deposition or sputtering on the gap layer of the MR device and the deposition is to a thickness of between approximately 10 A and 100 A with 20 Angstroms being preferred.

In row C it is seen that by inserting an intermediate layer of 5 A of FeCoMo between two layers of 125 A of FePtCu and capping the trilayer with 20 A of FeCoMo, a coercivity of 5240 Oe is obtained.

Figure 3A:
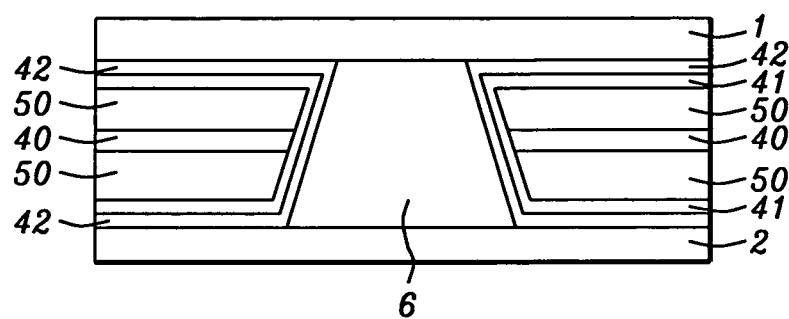
FIG. 3a is a schematic illustration of a CPP-MR read head of the present invention showing HB layers with multiple seed layers and capping layers and with the HB material formed (optionally) as a tri-layer.

Referring now to FIG. 3a there is shown, schematically, a CPP-MR read head that satisfies the objects of the present invention, preferably a CPP-TMR read head, that is biased laterally in much the same manner as is shown in FIG. 1a. Except in this figure, the HB layer is formed as a trilayer abutting the patterned MR stack (6), in which two layers of 125 A thick FePtCu (50) have a 20 A thick layer of FeCoMo (40) interposed between them. In addition, a bilayer of FeCoMo (41) and CrTi (42) has also been formed as a seed layer/capping layer surrounding the HB trilayer as is shown in row E of the table. It is understood that the seedlayer shown here as a bilayer could also be a single layer of CrTi as shown in row D of the table and described below.

In row D it is seen that by replacing the FeCoMo seedlayer/capping layer with 30 A of CrTi a similar result is obtained. It is further noted that the Cr, CrTi or any other Cr containing material when used as a seedlayer is deposited by ion beam deposition or sputtering on the gap layer of the sensor to a thickness between approximately 10 and 100 Angstroms, with 20 Angstroms being preferred.

In row E, where no seedlayer is used, the trilayer of row C is used and a bilayer capping layer of 20 A of FeCoMo and 30 A of CrTi A deposited on the FeCoMo by sputtering or IBD is used, a coercivity of 4322 Oe is obtained. This is a very attractive result, because the elimination of a seedlayer allows the HB layer to be deposited more closely on the sensor stack. Thus a more effective bias strength is expected.

Figure 3B:
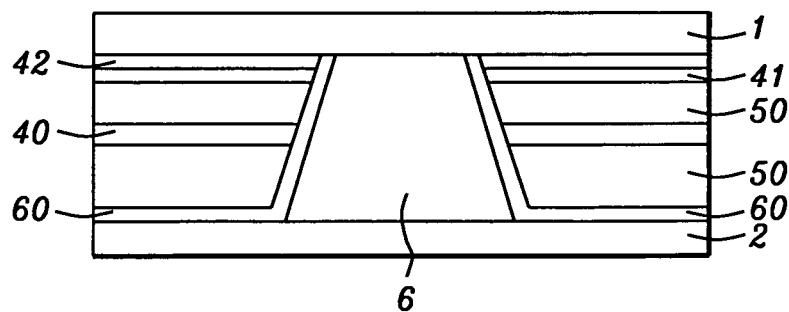
FIG. 3b is a schematic illustration of a CPP-MR read head of the present invention in which the absence of a seed layer allows the HB tri-layer magnets to be closer to the sides of the sensor element.

Referring to FIG. 3b, there is shown a schematic illustration of a sensor satisfying the objects of the present invention, showing an HB layer abutting a patterned GM stack (6). The HB layer is a trilayer formed of a first 125 A of FePtCu (50), a 5 A layer of FeCoMo (40) and a second 125 A layer of FePtCu (50). This trilayer requires no seed layer so it is separated from the substrate layer (2) and the sensor stack (6) only by a thin isolation layer (60). There is also a capping bilayer formed of a layer of 20 A FeCoMo (41) on which is formed a second capping layer of 30 A of CrTi (42).

Using a seedlayer or capping layer that contains Fe, such as the FeCoMo used above, provides an additional benefit to the FePtCu HB film of a higher saturation magnetization (Ms). Seedlayers or capping layers containing Fe can be adjusted in thickness according to the atom-percentage composition of the FePt film.

As is finally understood by a person skilled in the art, the preferred embodiments of the present invention are illustrative of the present invention rather than limiting of the present invention. Revisions and modifications may be made to methods, materials, structures and dimensions employed in forming and providing a MR sensor in which a hard bias layer of FePtCu is formed between seedlayers and capping layers that promote the Pt L10 phase and provide high coercivity at moderate annealing conditions, while still forming and providing such a device and its method of formation in accord with the spirit and scope of the present invention as defined by the appended claims.

What is claimed is:

1. A CPP MR sensor, comprising:
    an MR sensor stack including a horizontally biased free layer; wherein said horizontal bias is provided by a hard bias (HB) structure including a seedlayer structure, a FePt-containing magnetic layer structure formed on said seedlayer structure and a capping layer structure formed on said FePt-including magnetic layer wherein said seedlayer structure comprises a layer of FeCoMo formed to a thickness between approximately 10 and 100 Angstroms on a layer of CrTi that is formed to a thickness of between approximately 10 and 100 Angstroms.

2. The sensor of claim 1 wherein said seedlayer structure is deposited by sputtering or ion beam deposition (IBD).

3. The sensor of claim 1 wherein the thickness of said layer of FeCoMo is adjustable depending on the atom percentages of Fe and Pt in said FePt-including magnetic layer.

4. The sensor of claim 1 wherein said FePt-containing magnetic layer structure is a layer of FePt or FePtX, wherein X is Cu or Ag, and wherein said FePt or FePtX layer is formed to a thickness of between approximately 50 and 300 Angstroms.

5. The sensor of claim 4 wherein the composition of said layer of FePt is approximately 35 to 75 atomic percent of Fe with Pt having the remaining atomic percentage balance.

6. The sensor of claim 4 wherein said layer of FePtX is approximately 35 to 75 atomic percent of Fe, with between 0 and 15 atomic percent of X and with Pt having the remaining atomic balance.

7. The sensor of claim 1 wherein said FePt-containing magnetic layer structure comprises a first layer of FePtCu on which is formed a layer of FeCoMo on which is formed a second layer of FePtCu and wherein said first and second layers of FePtCu are formed to a thickness of approximately 125 A and wherein said layer of FeCoMo is formed to a thickness of approximately 5 angstroms.

8. The sensor of claim 1 wherein said capping structure is deposited by sputtering or ion beam deposition (IBD).

9. The sensor of claim 1 wherein said capping structure comprises layers of Fe, FeCo, or FeCoMo, wherein said layers have a thickness between approximately 10 and 100 angstroms.

10. The sensor of claim 1 wherein said capping structure comprises a layer of FeCoMo formed to a thickness between approximately 10 and 100 Angstroms on a layer of CrTi that is formed to a thickness of between approximately 10 and 100 Angstroms.

11. The sensor of claim 10 wherein the thickness of said layer of FeCoMo is adjustable depending on the atom percentages of Fe and Pt in said FePt-containing magnetic layer.

12. An MR sensor, comprising:
    an MR sensor stack including a horizontally biased free layer; wherein said horizontal bias is provided by a hard bias (HB) structure including a FePt-containing magnetic layer structure and a capping layer structure formed on said FePt-containing magnetic layer wherein said capping structure comprises a layer of Fe, FeCo or FeCoMo formed to a thickness between approximately 10 and 100 Angstroms.

13. The sensor of claim 12 wherein said capping structure is deposited by sputtering or ion beam deposition (IBD).

14. The sensor of claim 12 wherein said capping structure comprises a layer of FeCoMo formed to a thickness between approximately 10 and 100 Angstroms on which is formed a layer of CrTi that is formed to a thickness of between approximately 10 and 100 Angstroms.

15. The sensor of claim 14 wherein the thickness of said layer of FeCoMo is adjustable depending on the atom percentages of Fe and Pt in said FePt-including magnetic layer.

16. The sensor of claim 12 wherein said FePt-containing layer is a layer of FePt or FePtX, wherein X is Cu or Ag, and wherein said FePt-containing layer is formed to a thickness of between approximately 50 and 300 Angstroms.

17. The sensor of claim 16 wherein the composition of said layer of FePt is approximately 35 to 75 atomic percent of Fe with Pt having the remaining balance.

18. The sensor of claim 16 wherein said layer of FePtX is approximately 35 to 75 atomic percent of Fe, with between 0 and 15 atomic percent of X and with Pt having the remaining balance.

19. The sensor of claim 12 wherein said FePt-containing layer structure comprises a first layer of FePtCu on which is formed a layer of FeCoMo on which is formed a second layer of FePtCu and wherein said first and second layers of FePtCu are formed to a thickness of approximately 125 A and wherein said layer of FeCoMo is formed to a thickness of approximately 5 angstroms.

* * * * *

UNITED STATES PATENT AND TRADEMARK OFFICE
CERTIFICATE OF CORRECTION

PATENT NO. : 8,493,694 B2  
APPLICATION NO. : 12/927697  
DATED : July 23, 2013  
INVENTOR(S) : Min Zheng et al.

Page 1 of 1

It is certified that error appears in the above-identified patent and that said Letters Patent is hereby corrected as shown below:

On the Title Page, Item (54) and in the Specification, Column 1, delete the Title "Fabrication Of A Coercivity Hard Bias Using FePt Containing Film" and replace with -- Fabrication Of A High Coercivity Hard Bias Using FePt Containing Film --.

Signed and Sealed this
Twenty-fourth Day of September, 2013

Teresa Stanek Rea
*Deputy Director of the United States Patent and Trademark Office*